United States Patent [19]
Tohi et al.

[11] Patent Number: 5,930,155
[45] Date of Patent: Jul. 27, 1999

[54] METHOD OF EVALUATING ENDURANCE OF VEHICLE WHEEL BY COMPUTER SIMULATION

[75] Inventors: Yasuto Tohi; Susumu Kubo, both of Saitama-ken, Japan

[73] Assignee: Hitachi Metals, Ltd., Tokyo, Japan

[21] Appl. No.: 08/947,102

[22] Filed: Oct. 8, 1997

[30] Foreign Application Priority Data

Mar. 25, 1997 [JP] Japan ................................. 9-071246

[51] Int. Cl.⁶ ................................. G06F 15/18
[52] U.S. Cl. ................. 364/578; 364/513; 364/474.194; 73/146; 73/810
[58] Field of Search .................... 364/578, 513, 364/474.194; 73/146, 810

[56] References Cited

U.S. PATENT DOCUMENTS

| | | | |
|---|---|---|---|
| 4,965,743 | 10/1990 | Malin et al. | 364/513 |
| 4,998,440 | 3/1991 | Baumel | 73/810 |
| 5,016,204 | 5/1991 | Simoudis et al. | 364/578 |
| 5,046,368 | 9/1991 | Baumel | 73/810 |
| 5,610,330 | 3/1997 | Fricke et al. | 73/146 |
| 5,633,800 | 5/1997 | Bankert et al. | 364/474.194 |
| 5,750,890 | 5/1998 | Fricke et al. | 73/146 |

FOREIGN PATENT DOCUMENTS 7164815  6/1995  Japan .

OTHER PUBLICATIONS

Fatigue Under Complex Loading, Analyses and Experiments, vol. 6, R.M. Wetzel, Editor Paper included here Notched Member Fatigue Life Predictions by the Local Strain Approach,1997.
Computational Modeling of Tires,1994.
Abaqus Contents (User Manual and Example Manual),1995.

*Primary Examiner*—Kevin J. Teska
*Assistant Examiner*—Mark J. Fink
*Attorney, Agent, or Firm*—Sughrue, Mion, Zinn, Macpeak & Seas, PLLC

[57] ABSTRACT

A method of evaluating endurance of a vehicle wheel by computer simulation of a dynamic radial fatigue test. The modeling of the system is simplified by modeling the tire portion made of a nonlinear material by linear elements, and modeling each of the air pressure, the press-contact effect of the tire bead portion and the load applied through the contact between the tire and the drum is modeled as the direct load. With such a modeling, the stress applied to the vehicle wheel can be calculated by the linear analysis instead of the nonlinear analysis, and as a results thereof, the memory capacity and the calculation time are reduced.

12 Claims, 10 Drawing Sheets

METHOD OF EVALUATING ENDURANCE OF VEHICLE WHEEL BY COMPUTER SIMULATION

BACKGROUND OF THE INVENTION

The present invention relates to a method of evaluating the endurance of vehicle wheel (rim) made of aluminum, steel, etc., wherein the distribution of stress applied to the wheel during the dynamic radial fatigue test is calculated by linear numerical analysis.

Figure 1:
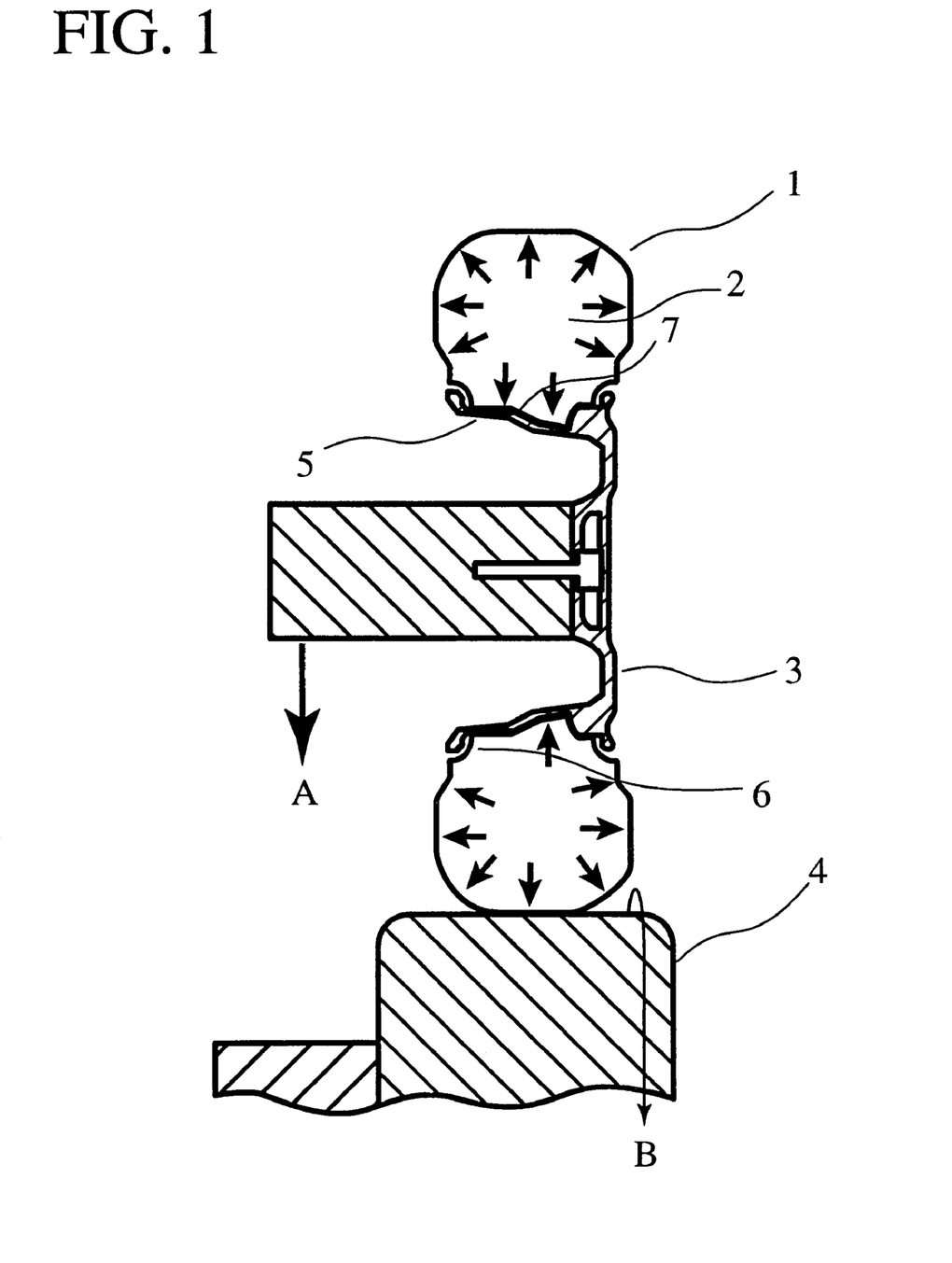
FIG. 1 is a schematic illustration showing a method of dynamic radial fatigue test.

A testing apparatus for evaluating the dynamic radial fatigue of vehicle wheel is schematically shown in FIG. 1. In the dynamic radial fatigue test, a wheel 3 on which a tire 1 is mounted is pressed on a peripheral surface of a drum 4 rotating in the direction indicated by an arrow B. The wheel 3 and the tire 1 are allowed to rotate for a long period of time to evaluate the fatigue endurance of the wheel 3.

Figure 9:
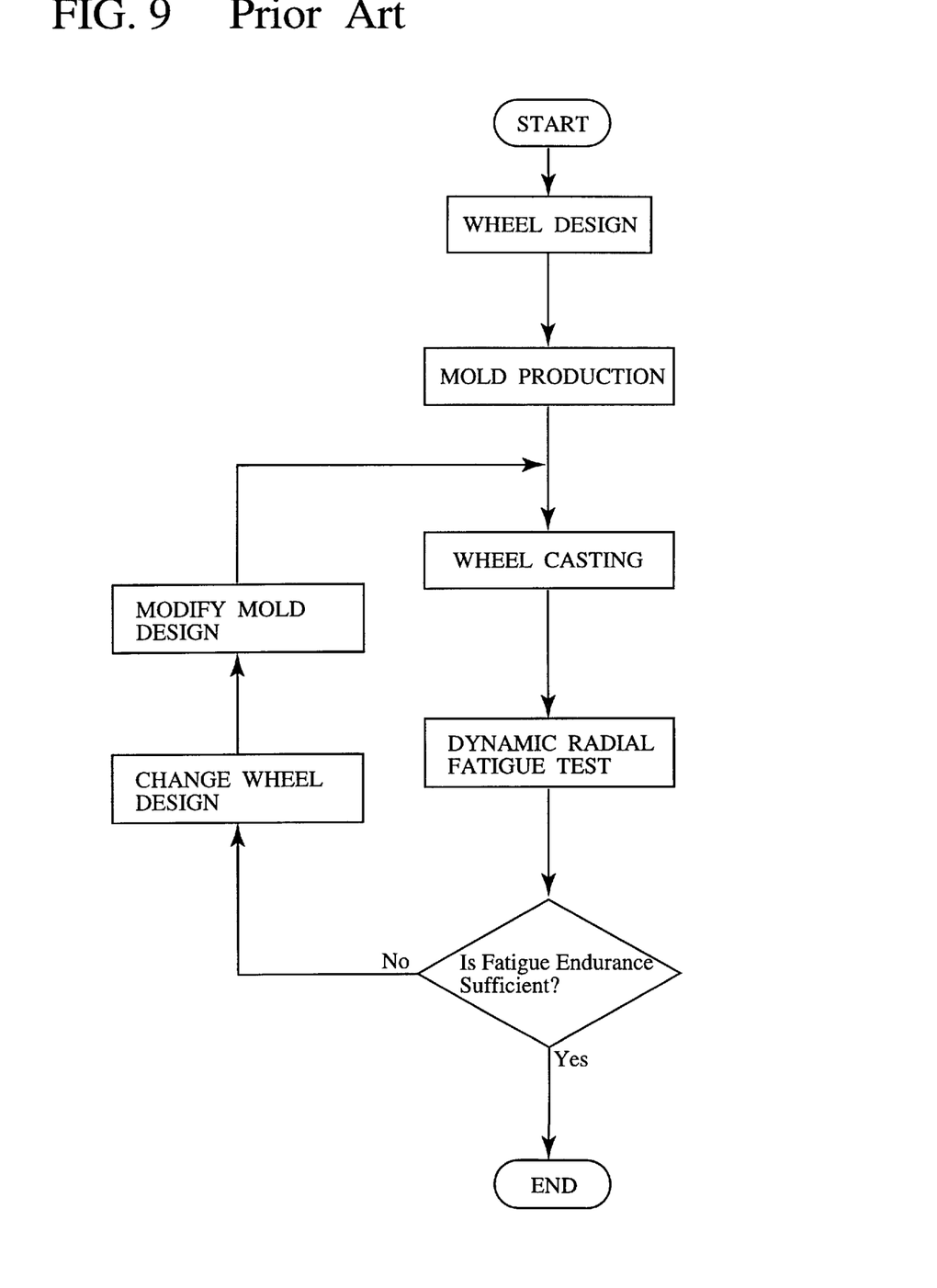
FIG. 9 is a flowchart showing a conventional method of optimizing wheel design.

In the conventional methods, a physical wheel manufactured through the wheel design, the mold manufacturing and the casting has been actually subjected to the dynamic radial fatigue test to evaluate the endurance of the wheel. Since the dynamic radial fatigue test is a fatigue endurance test, the time taken to obtain results is from one to two weeks. If the results are not satisfactory, after the wheel design is changed and the mold is modified, another physical wheel should be cast and the dynamic radial fatigue test should be repeated on the wheel (FIG. 9). This requires much time and labor to prevent an expeditious development of a new wheel.

The evaluation methods by a computational simulation using numerical analysis have lately attracted considerable attention in the field of automotive parts. For example, Japanese Patent Laid-Open No. 7-164815 discloses a computational designing method of pneumatic tire by nonlinear analysis. It has been expected that the results of the dynamic radial fatigue test can be predicted and the wheel design and the mold design can be changed or modified based on the predicted results without manufacturing physical wheel or mold, thereby expediting the development of new wheels, if the computational simulation can be applied to the evaluation of dynamic radial fatigue of vehicle wheels. However, since the dynamic radial fatigue test involves the nonlinear problems of the tire structure and the contact problem between the tire and the drum, the computational analysis of the test has been presumed to require a lot of time for solving the nonlinear problems. Therefore, the computational simulation of the dynamic radial fatigue test has not yet been put to practical use.

Figure 2:
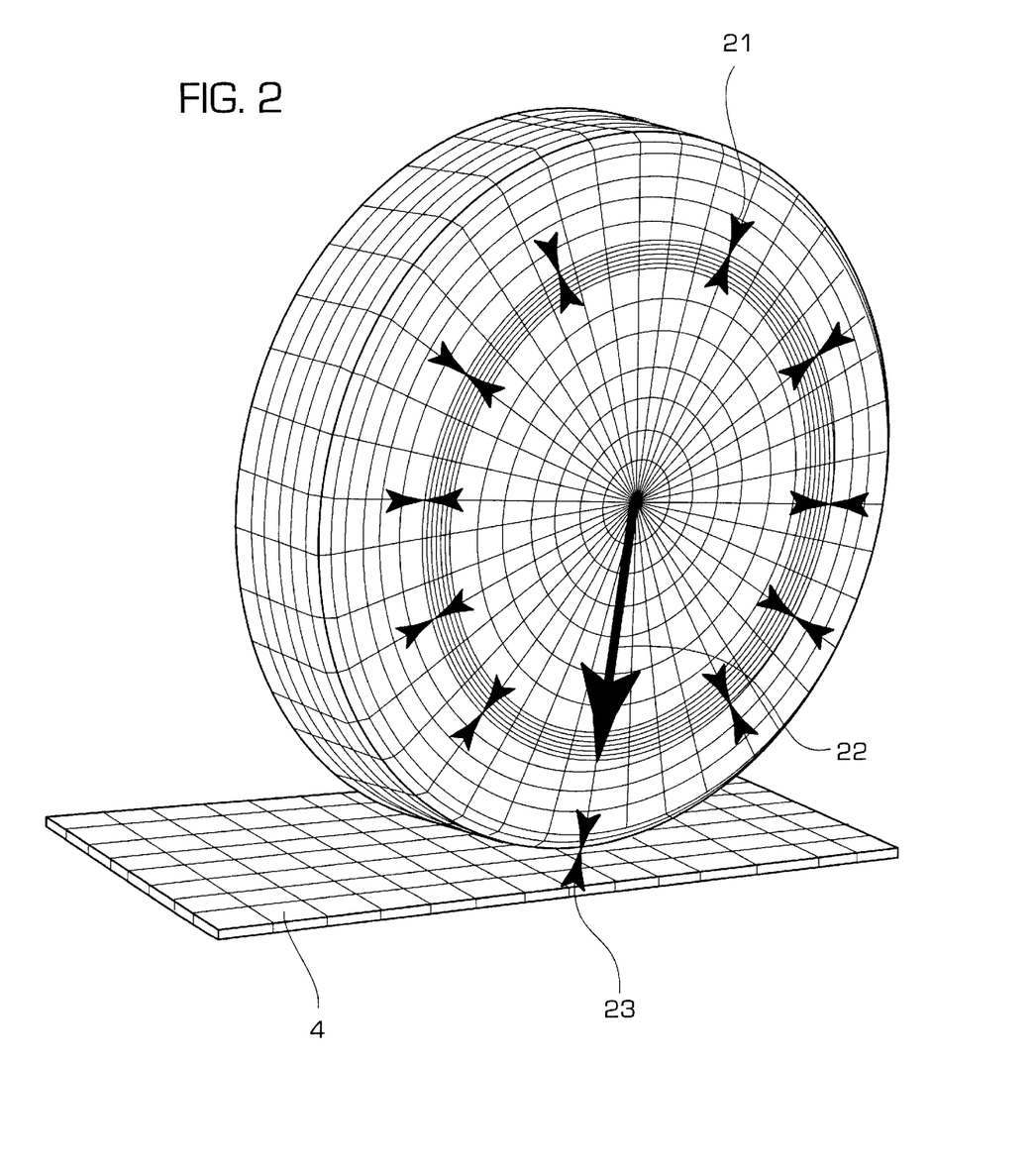
FIG. 2 is a computational illustration showing a model for nonlinear stress analysis.

FIG. 2 shows a finite element model which may be applicable to nonlinear numerical analysis for simulating the dynamic radial fatigue test of a wheel. As seen from FIGS. 1 and 2, the tire portion, the air pressure portion 2, the press-contacting effect of the tire bead portion 6 against the wheel flange 5 which occurs in combination with weight of the tire portion and the pressure from the air pressure portion, and the load (A in FIGS. 1 and 22 in FIG. 2) applied through the contact between the drum and the tire are directly modeled for numerical analysis in conformity with the geometric shape of the tire and wheel.

The wheel portion is modeled by three-dimensional solid elements. Since the tire portion is made of a nonlinear composite materials comprising a rubber matrix and a reinforcing filler such as steel wire and nylon cord, the tire portion is modeled as an anisotropic nonlinear material. The air pressure portion is modeled as a compressible air. The press-contact effect of the tire bead portion against the wheel flange, which is a composite action of the weight of tire portion and the air pressure, is treated as a contact problem between the tire bead portion and the tire flange as indicated by reference numeral 21 in FIG. 2. The load applied through the contact between the tire and the drum as the contacting force of the tire bead portion to the wheel flange is treated as a nonlinear contact problem between the tire and the drum as indicated by reference numeral 23 in FIG. 2.

To solve the above problems, the portions other than the wheel portion should be modeled in exact conformity with the geometric shapes. Therefore, in the above method, the tire portion should be represented by nonlinear three-dimensional solid elements and the distribution of stress is calculated by the nonlinear analysis including the analysis of a large strain and large deformation.

Thus, in the above method, various nonlinear factors such as the nonlinear tire material, the contact problem between the drum and the tire, the contact problem between the tire bead portion and the wheel flange and the compression problem of the air in the tire should be calculated simultaneously with the calculation of the stress generated on the wheel. Such a calculation takes a lot of time even when a super computer is used.

Since, in the dynamic radial fatigue test, both the wheel and the tire are rotated on the drum, the dynamic radial fatigue test is difficult to be simulated by symmetric analysis although depending on the wheel design. This prevents the dynamic radial fatigue test from being simulated by a model simplified by the symmetry of the system, although the symmetry is usually employed in various numerical analysis. Therefore, the complete system of the dynamic radial fatigue test including the wheel should be modeled. This makes the analysis time unduly long and sometimes the analysis cannot be completed due to a large number of factors to be analyzed.

As mentioned above, the method utilizing nonlinear analysis requires an expensive computer, a large storage capacity and a large memory capacity as well as a lot of time for the wheel design. Therefore, the nonlinear computational simulation method is considered to make little contribution to promoting the development of the wheel.

OBJECT AND SUMMARY OF THE INVENTION

Accordingly, an object of the present invention is to provide a method of evaluating the endurance of a vehicle wheel by calculating the distribution of stress applied to the wheel by computer simulation without the need of physically modifying the wheel and actually repeating the dynamic radial fatigue test on the modified wheel.

The inventors have found that a simplified model, in which the nonlinear tire material and the nonlinear contact problem are replaced by linear conditions, provides in a reduce period of time calculated results in fair agreement with the experimental results with respect to the stress distribution of the wheel during the dynamic radial fatigue test, thereby reducing the time required for optimizing the wheel design. The present invention has been achieved based on this finding.

Thus, in an aspect of the present invention, there is provided a method of evaluating endurance of a vehicle wheel by computer simulation of a dynamic radial fatigue test, wherein a tire portion made of a nonlinear material is modeled by linear elements and subjected to a linear numerical analysis.

DETAILED DESCRIPTION OF THE INVENTION

In the method according to the present invention, the distribution of stress applied to a vehicle wheel is evaluated by a computer simulation of the dynamic radial fatigue test. The most important feature of the method is that the tire portion which is made of nonlinear composite material is modeled by linear elements in stead of nonlinear elements, which is then numerically analyzed. The tire portion is modeled by linear elements such as two-dimensional shell elements, one-dimensional beam elements, three-dimensional solid elements, and a combination thereof. The air pressure acting on the internal surface of the tire portion, the press-contact effect of the tire bead portion against the wheel flange, the load applied through the contact between the tire and the drum are treated as the direct loads. Thus, in the method of the present invention, the nonlinear material problem of tire and the nonlinear contact problem have been simplified by the linear modeling.

Figure 3:
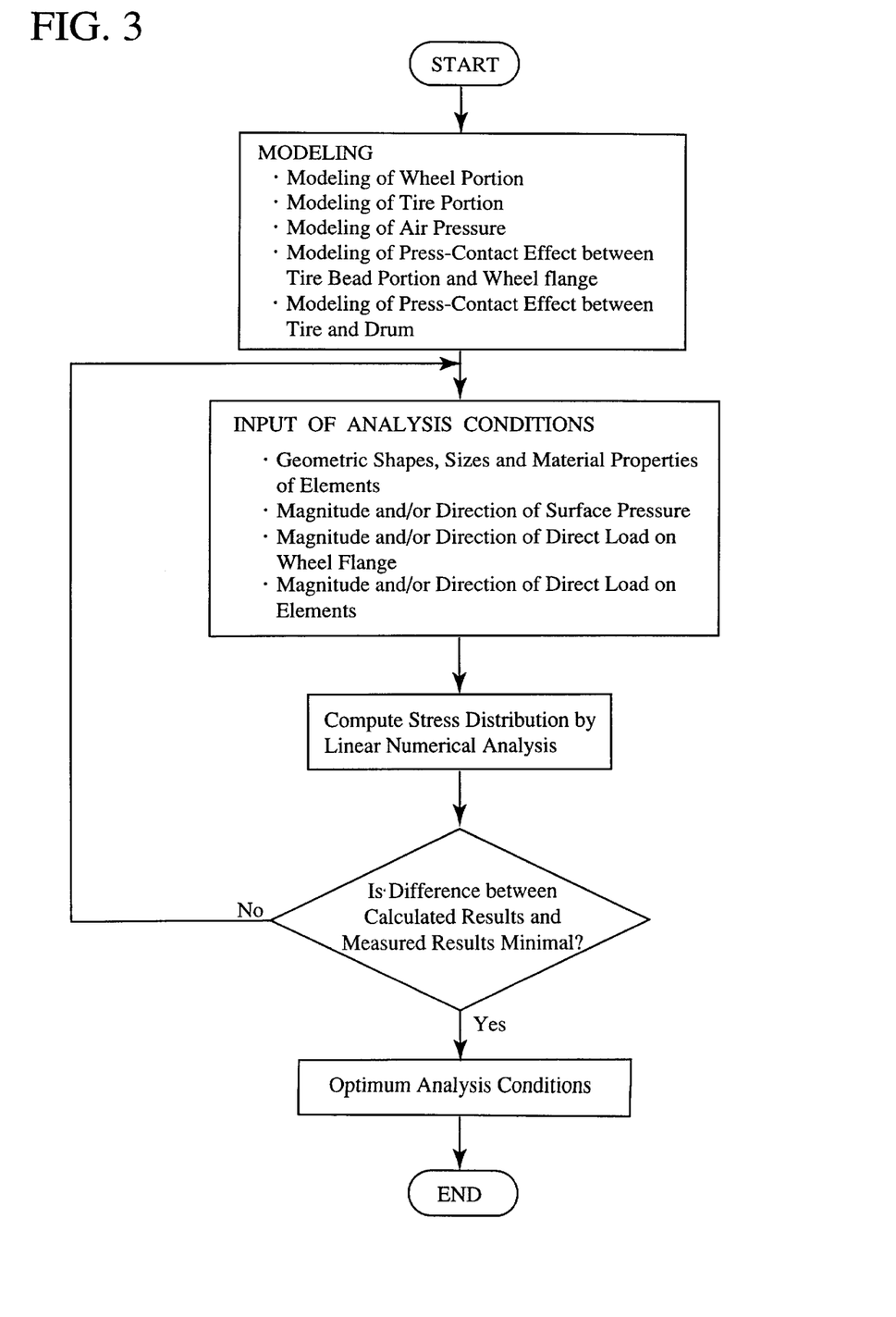
FIG. 3 is a flowchart of computations for determining the distribution of stress on a wheel employed in the present invention.

A preferred embodiment of the present invention employs the finite element method to carry out the computer simulation of the dynamic radial fatigue test according to the steps outlined in FIG. 3.

The simulation requires modeling of the wheel portion, the tire portion, the air pressure portion, the press-contact effect of the tire bead portion on the wheel flange and the load from the dynamic radial fatigue testing apparatus, and input the geometrical shapes, the material properties, and the magnitudes and/or directions of the pressure and the loads.

The system of the dynamic radial fatigue test is modeled as follows.
(1) The tire portion is modeled by the linear elements such as two-dimensional shell elements, one-dimensional beam elements, three-dimensional solid elements and a combination thereof so as to define the contours of the tire portion, without modeling by the nonlinear elements in exact conformity with the actual geometric shape of the tire portion.
(2) The wheel portion is modeled by the linear three-dimensional solid elements.
(3) The air pressure is modeled as the surface pressure applied to the inner surface of the rim portion (reference numeral 7 in FIG. 1).
(4) The press-contact effect of the tire bead portion on the wheel flange is modeled as the direct load applied to the wheel flange.
(5) The load applied from the dynamic radial fatigue testing apparatus through the contact between the tire and the drum is modeled as the direct load applied to each of the linear elements modeling the tire portion.

Then, the following initial data for the analysis conditions are input.
(1) The geometric shapes, sizes and material properties for each of the linear elements, such as two-dimensional shell elements, one-dimensional beam elements, three-dimensional solid elements and a combination thereof, which define the tire portion.
(2) The material properties for each of the linear three-dimensional solid elements defining the wheel portion.
(3) The magnitudes and/or the directions of the air pressure applied on the inner surface of the rim portion.
(4) The magnitudes and/or the directions of the direct load to the wheel flange, which direct load is a model for the press-contact effect of the tire bead portion on the wheel flange.
(5) The magnitudes and/or the directions of the direct load applied to each of the linear elements defining the tire portion, which is a model for the load applied from the dynamic radial fatigue testing apparatus.

After the initial data for the analysis conditions are input, the distribution of the stress applied to the wheel is calculated by linear analysis. The calculated results are then compared with the measured results by using, for example, the following error function: Error Function=$\Sigma$ ((calculation/measurement)$-1)^2$. If the difference between the calculated results and the measured results is not substantially zero, the linear analysis is repeated with at least one of the analysis conditions such as shell thickness, beam diameter, etc. modified until the difference (error function) is minimized to determine the optimum analysis conditions (optimized linear tire model). The inventors have further found that the optimum analysis conditions thus determined can be utilized without change for computing the stress distribution of other wheel designs so long as the tire is made of the same material and has the same structure, namely, the optimum analysis conditions are constant with respect to the same type of tire in computing the stress distribution of various wheel designs. This makes the optimization of wheel design easier.

Figure 10:
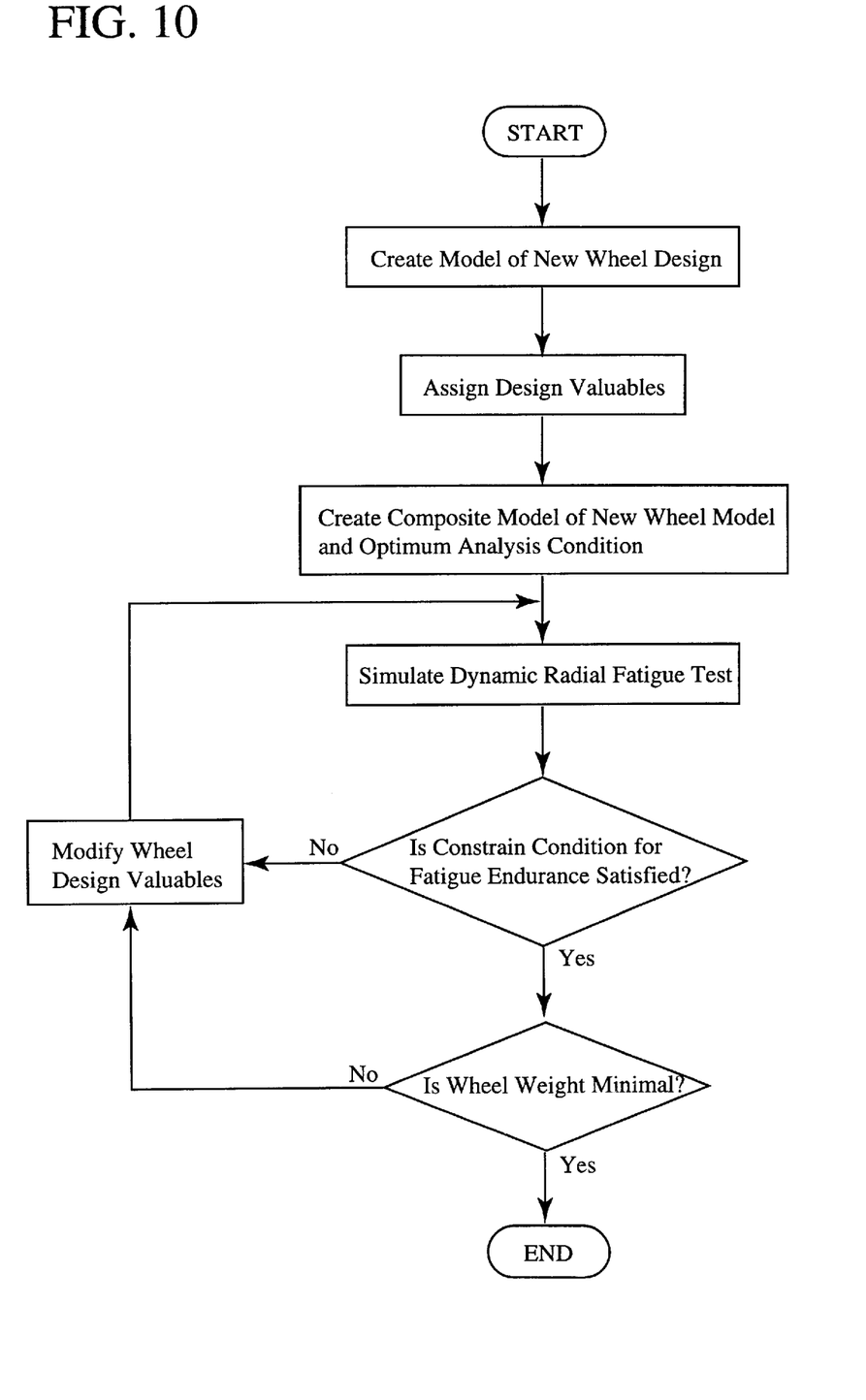
FIG. 10 is a flowchart of computations for optimizing the wheel design employed in the present invention.

By using the optimum analysis conditions thus determined, the distribution of the stress applied on the wheel is calculated by linear numerical analysis while changing the wheel design with a reduced memory capacity and a reduced period of time required for computational calculation. More specifically, the optimization of wheel design is carried out, for example, as outlined in FIG. 10.
(1) A wheel design being evaluated is modeled by the linear three-dimensional solid elements.
(2) Design valuables such as window shape, shape of rib structure, thickness of disk portion, thickness of rim portion, etc. are assigned to the elements.
(3) A composite model of the wheel model obtained above and the optimum analysis conditions (optimized linear tire model) determined as mentioned above is created.
(4) The dynamic radial fatigue test is computer simulated by linear numerical analysis to calculate the stress distribution on the wheel. Since the optimum analysis conditions are linear, the composite model is also linear. Therefore, the time required for calculation is extremely reduced as compared with the nonlinear analysis.

(5) The calculated results are examined whether the constrain condition for the fatigue endurance is satisfied. The constrain condition for the fatigue endurance is set based on the maximum main stress, maximum shear stress, Mises equivalent stress derived from the maximum main stress and maximum shear stress, etc. The conditions other than the maximum main stress are very difficult to be measured in the actual dynamic radial fatigue test, and therefore, the constrain condition including the maximum shear stress, Mises equivalent stress, etc. enhances the accuracy of the computational evaluation.

(6) If the calculated results do not satisfy the constrain condition for the fatigue endurance, the steps (4) and (5) are repeated with at least one of the wheel design valuables modified until the constrain condition is satisfied.

(7) If the constrain condition is satisfied, the computation examines whether or not the weight of the wheel is minimized. If not, the steps (4) to (6) are repeated with at least one of the wheel design valuables modified until the minimized weight is achieved, thereby determining the optimum wheel design.

Based on the optimum wheel design determined by computational simulation, a wheel of new design is cast through mold design and mold production as employed in the conventional method.

The present invention is described further in detail by reference to the drawings which should be considered to illustrate preferred embodiments of the present invention.

Figure 4:
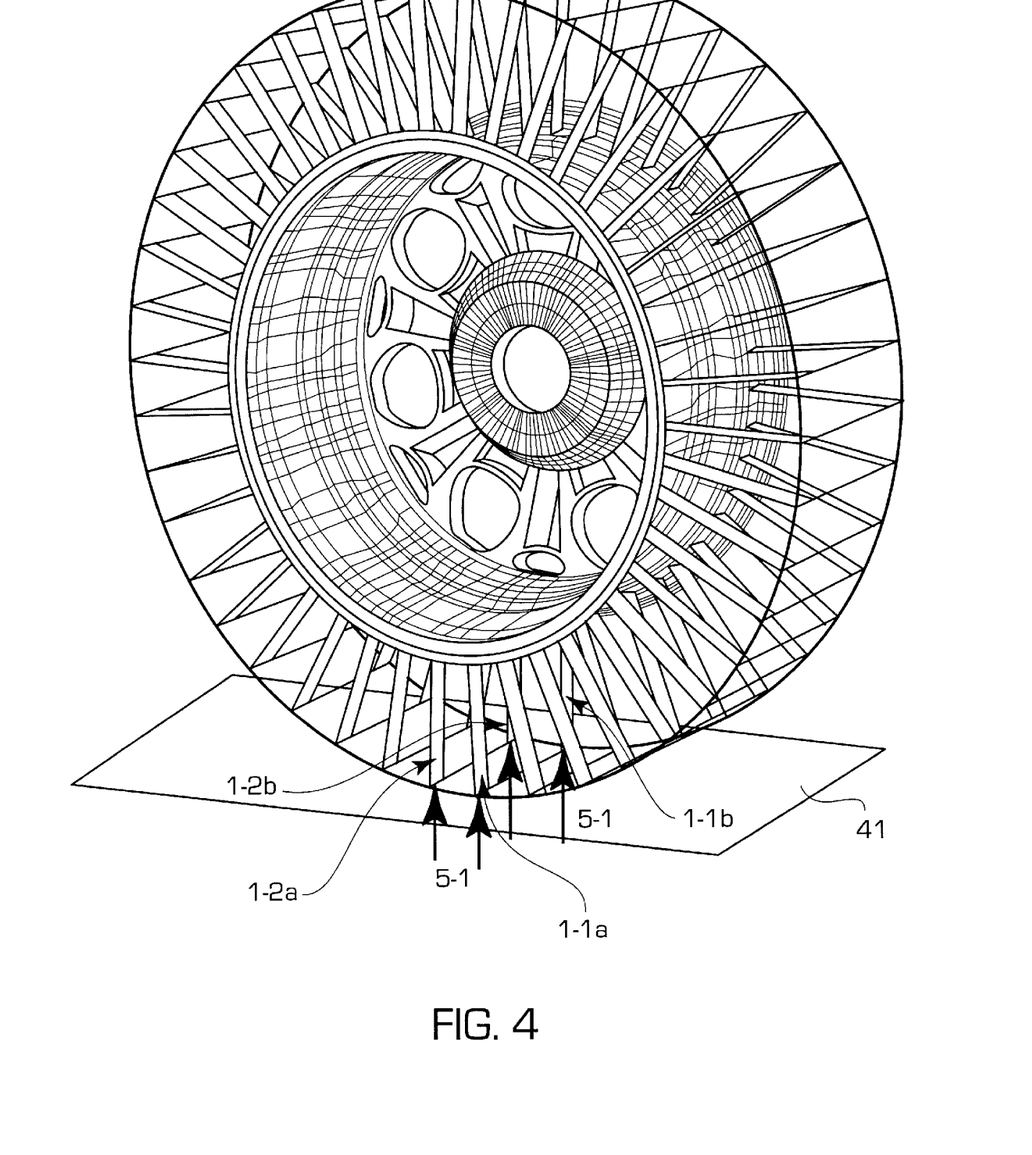
FIG. 4 is a computational illustration showing a model for linear stress analysis used in the present invention.
Figure 5:
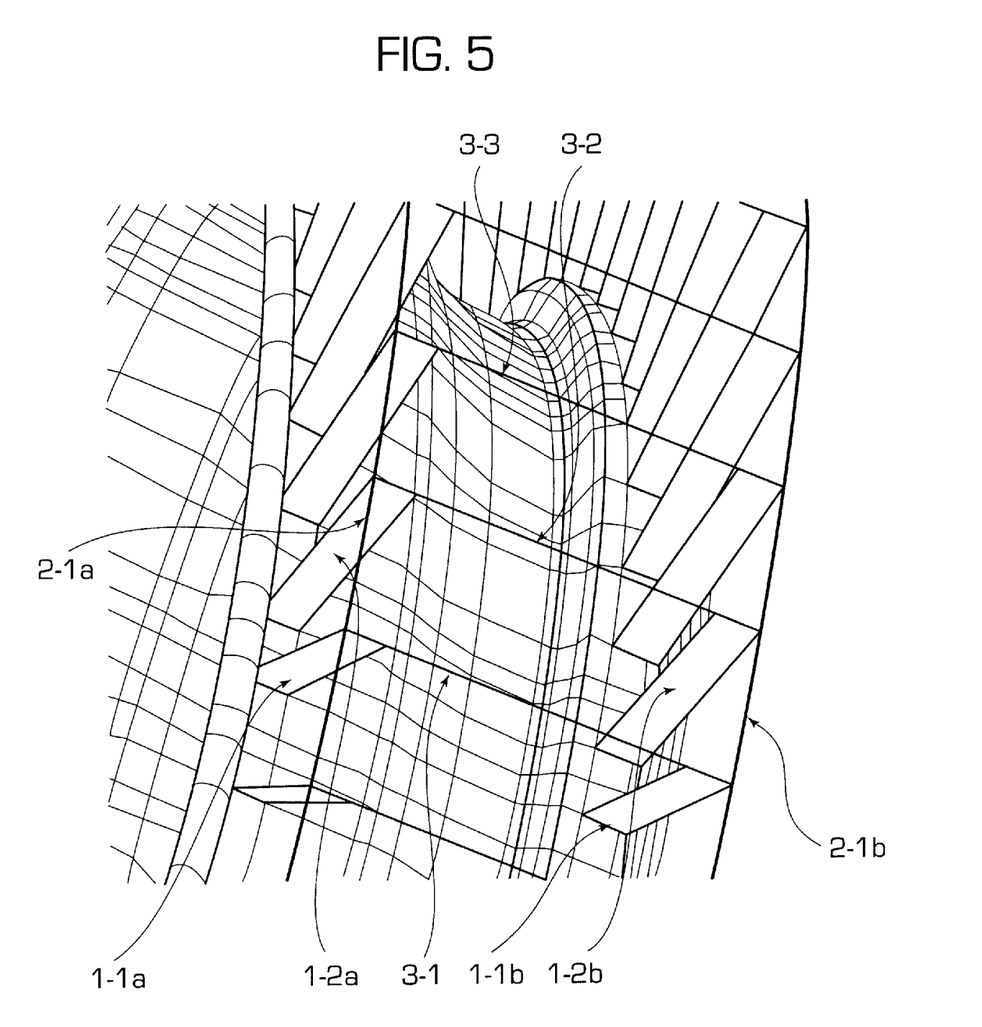
FIG. 5 is a partly enlarged view of the model shown in FIG. 4.

FIG. 4 is a computational illustration showing a finite element model for calculating the distribution of stress on the wheel during the dynamic radial fatigue test, and FIG. 5 is a partly enlarged view of the model. As seen from FIGS. 4 and 5, the tire portion is modeled by the linear shell elements which extend radially and align along the circumferential direction in two rows (a row of 1-1a, 1-2a, etc. and another row of 1-1b, 1-2b, etc.), the linear beam elements (represented by 2-1a and 2-1b in FIG. 5) connecting the linear shell elements in each row (1-1a, 1-2a, etc. and 1-1b, 1-2b, etc.) in the circumferential direction, and the linear beam elements (represented by 3-1, 3-2 and 3-3 in FIG. 5) each connecting in the axial direction two linear shell elements (1-1a and 1-1b, 1-2a and 1-2b, etc.) which are axially adjacent to each other. In the embodiments in FIGS. 4–6, the width of the linear shell elements is the same as that of the linear three-dimensional elements modeling the wheel. The number of the elements and the connecting portion between the shell elements and the beam elements are not strictly limited because the effect of number of elements and the connecting portion are assimilated in the subsequent optimization step. By these shell elements and the beam elements, the contours of the tire portion is represented.

Figure 6:
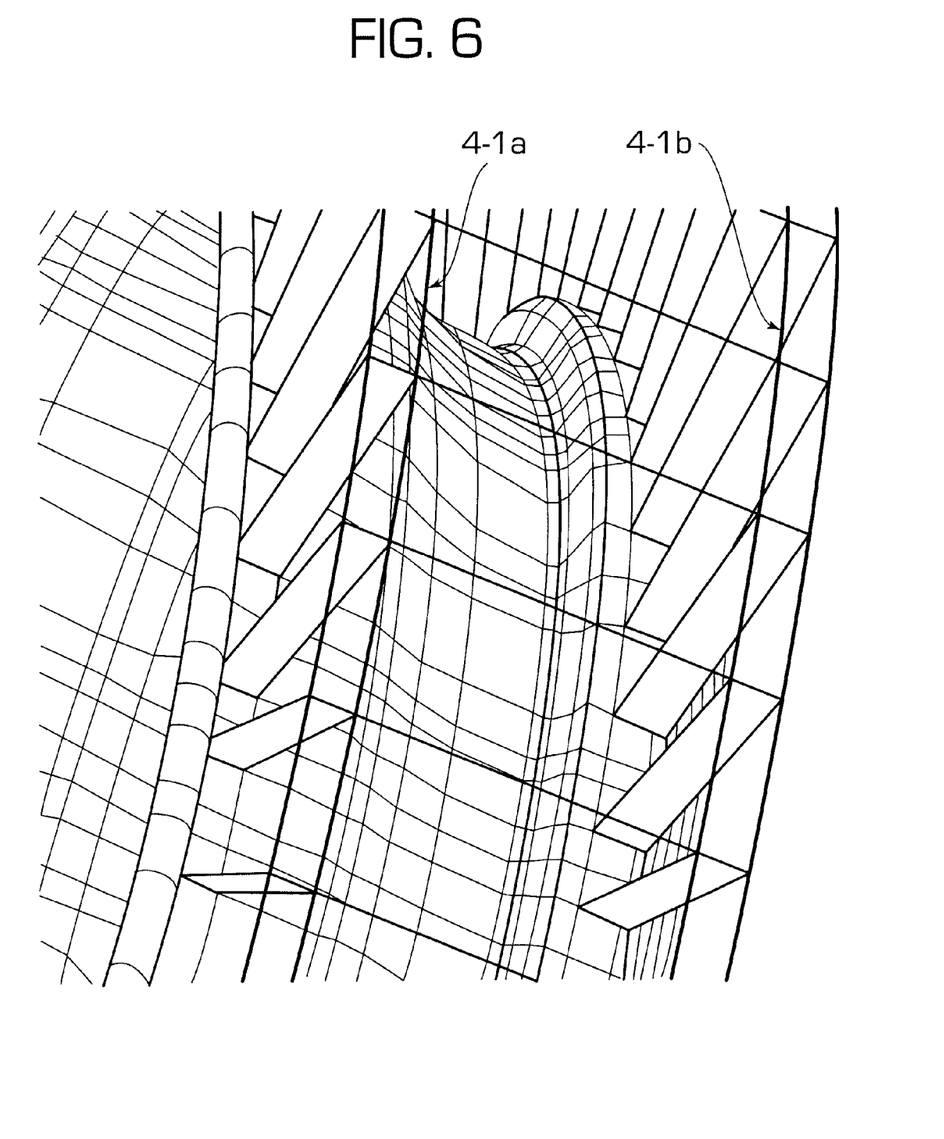
FIG. 6 is a computational illustration showing another model for linear stress analysis used in the present invention.
Figure 7:
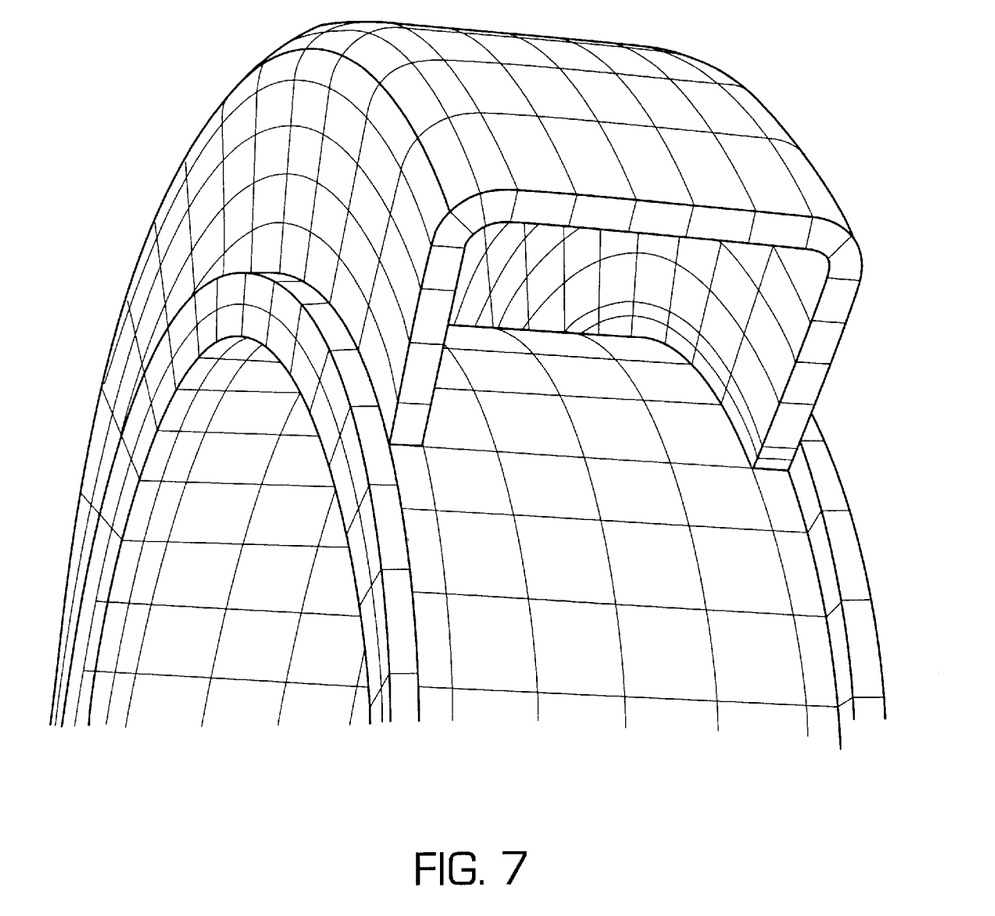
FIG. 7 is a computational illustration partly in cross sectional view showing a modeling of tire portion by linear solid elements.

The modeling of the tire portion may further include, as shown in FIG. 6, other linear beam elements 4-1a and 4-1b in rows of two connecting each row of the linear shell elements (1-1a, 1-2a, etc. and 1-1b, 1-2b, etc.) in the circumferential direction. Alternatively, the tire portion may be modeled by three-dimensional solid elements as shown in FIG. 7 in which the tire portion is partly broken away to show the three-dimensional solid elements.

As shown in FIG. 4, the load applied by the dynamic radial fatigue testing apparatus through the contact between the tire and the drum is modeled as the load applied to the two-dimensional elements 1-1a, 1-2a, 1-1b and 1-2b in the direction perpendicular to the tangent plane 41 between the tire and the drum as indicated by arrows 5-1 in FIG. 4.

The air pressure is modeled as the surface pressure normal to the surface of the three-dimensional solid elements of the rim portion facing the inside of tire portion, and the press-contact effect of the tire bead portion on the wheel flange is modeled as the nodal direct load applied to each node of the three-dimensional solid elements in the portion at which the tire bead portion and the wheel flange are in contact with each other (both not shown in FIGS. 4–6).

Next, the initial data for analysis conditions are input as described below.

The geometric shapes, sizes and material properties such as Young's modulus, Poisson ratio, etc. are assigned to the linear shell elements, the linear beam elements and linear three-dimensional solid elements each modeling the tire portion.

The material properties such as Young's modulus, Poisson ratio, etc. are assigned to the linear solid elements defining the wheel portion.

The magnitudes and/or the directions of the air pressure applied on the inner surface of the rim portion are provided with respect to each three-dimensional solid element of the rim portion of the wheel elements. The magnitudes and/or the directions of the direct load to the wheel flange, which direct load is a model for the press-contact effect of the tire bead portion on the wheel flange, are provided with respect to each three-dimensional solid element of wheel flange elements which are connected with the tire bead portion elements.

The magnitudes and/or the direction of the load applied by the dynamic radial fatigue testing apparatus through the contact between the tire and the drum is assigned to the two-dimensional shell elements contacting the drum surface (1-1a, 1-2a, 1-1b and 1-2b in FIG. 4) as the load perpendicular to the tangent plane 41 between the tire and the drum. Although the load is assigned to four shell elements in FIG. 4, the number of the shell elements is not restricted to four.

Then, the distribution of stress on the wheel is calculated by the linear numerical analysis. The calculated stress distribution is compared with the measured stress distribution. If the difference between the simulation results and the measured results is not substantially zero, the calculation of the stress distribution by the linear numerical analysis is iterated until the difference is minimized to determine the optimum analysis conditions while modifying the initial data for the analysis conditions, particularly the geometric shapes, sizes and material properties assigned to the shell elements and the beam elements for the tire portion, the material properties assigned to the solid elements for the wheel portion and the magnitude of the load assigned to the shell elements for the tire portion. Example of the optimum analysis conditions determined in the manner described above is shown in the following Table 1.

TABLE 1

|  | Young's Modulus (kgf/mm$^2$) | Poisson Ratio | Geometric Shape (mm) |
|---|---|---|---|
| Tire Portion |  |  |  |
| Shell Elements | 5 | 0.49 | 5 (thickness) |
| Beam Elements | 50 | 0.49 | 100 (diameter) |
| Wheel | 7000 | 0.3 |  |

Figure 8:
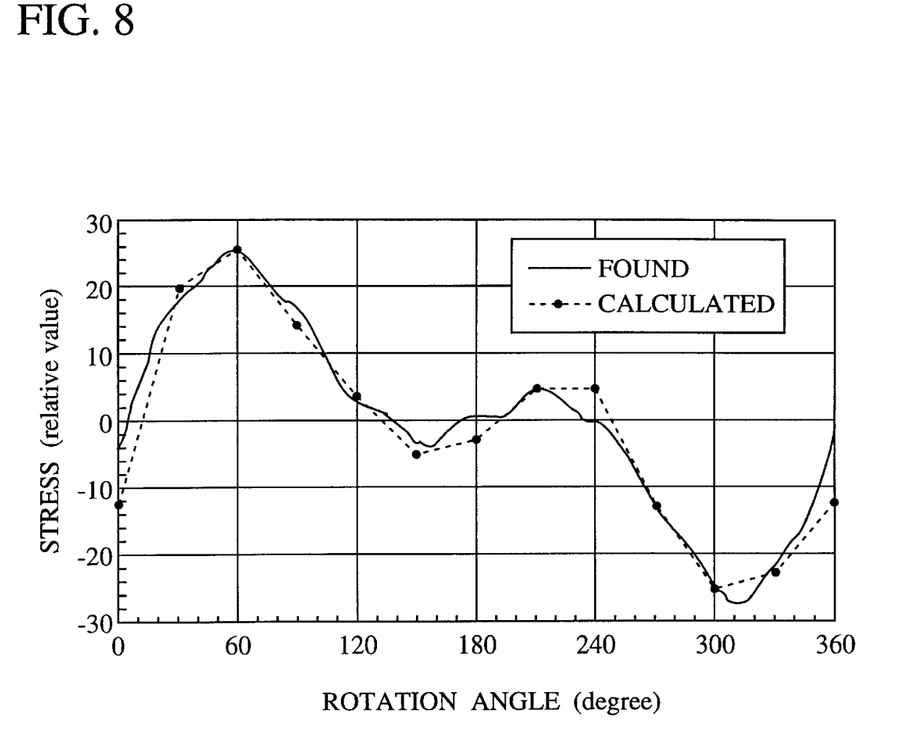
FIG. 8 is a graph showing the distribution of stress applied to the wheel of the model shown in FIG. 4 obtained by measurement and computational calculation of the present invention.

The simulation results of the stress distribution with respect to the rotation angle of a given element of the wheel during the dynamic radial fatigue test on the model shown in FIG. 4 by the linear numerical analysis using the optimum analysis conditions obtained above are shown in FIG. 8 together with the measured results on the same model. As seen from FIG. 8, the calculated results obtained using the optimum analysis conditions determined according to the present invention are in fair agreement with the measured results, this proving that the simulation method of the present invention can exactly evaluate the distribution of stress applied on the wheel.

Further, as mentioned above, the analysis conditions optimized in the manner described above can be applied to the stress analysis of the wheels of different design so long as the tire is made of the same material and the wheel has the same size and offset size. Namely, when optimum analysis conditions are once determined with respect to a combination of a certain type of tire and a wheel, there is no need to reoptimize the analysis conditions in the subsequent simulation after changing the wheel design. As a result thereof, the time required for the computational stress analysis can be reduced.

The time required for completing the simulation of the dynamic radial fatigue test was about 8 hours in the method of the present invention, whereas about 64 hours in the conventional method by nonlinear numerical analysis. Thus, the method of the present invention reduces the computational calculation time to about ⅛ of the time required in the conventional method.

As described above, the method of evaluating the endurance of wheel by a computer simulation of the dynamic radial fatigue test according to the present invention simplifies the modeling of the tire portion. Since the nonlinear tire portion is modeled by the linear elements, the time required for completing the computational stress analysis is extremely reduced. Also, the method of the present invention provides the simulation results which are in fair agreement with the measured results. The method of the present invention having such advantages makes the physical modification of the wheel unnecessary and reduce the time and cost for developing new products.

What is claimed is:

1. A method of evaluating endurance of a vehicle wheel by computer simulation of a dynamic radial fatigue test, wherein a tire portion made of a nonlinear material is modeled by linear elements and subjected to a linear numerical analysis.

2. The method according to claim 1, wherein said linear elements are two-dimensional shell elements, one-dimensional beam elements, three-dimensional solid elements or a combination thereof.

3. The method according to claim 1, wherein a pressure of air filling said tire portion is modeled by a surface pressure acting on an inner surface of said tire portion contacting said wheel.

4. The method according to claim 1, wherein a press-contact effect of a tire bead portion on a wheel flange is modeled by a direct load acting on said wheel flange.

5. The method according to claim 1, wherein a load applied by a dynamic radial fatigue testing apparatus through a contact of said tire portion and a drum is modeled by a direct load acting on said linear elements.

6. A method of evaluating endurance of a vehicle wheel by calculating a distribution of stress applied to said vehicle wheel by computer simulation of a dynamic radial fatigue test of said vehicle wheel mounting a tire thereon, said method comprising the steps of:

(a) modeling a wheel portion by linear three-dimensional solid elements;

(b) modeling a tire portion by linear elements comprising two-dimensional shell elements aligning in two rows along a circumferential direction, one-dimensional beam elements connecting said two-dimensional shell elements of each row in a circumferential direction, and one-dimensional beam elements connecting said two-dimensional shell elements in an axial direction;

(c) modeling a pressure by air filling said tire portion as a surface pressure acting on an inner surface of said tire portion contacting said wheel;

(d) modeling a press-contact effect of a tire bead portion on a wheel flange as a direct load acting on a wheel flange;

(e) modeling a load applied from a dynamic radial fatigue testing apparatus through a contact between said tire portion and a drum as a direct load acting on each of said shell elements of said tire portion;

(f) providing geometric shapes, sizes and material properties with respect to each of said linear elements modeling said tire portion;

(g) providing material properties with respect to each of said solid elements modeling said wheel portion;

(h) providing a magnitude and/or a direction of said surface pressure;

(i) providing a magnitude and/or a direction of said direct load acting on the wheel flange;

(j) providing a magnitude and/or a direction of said direct load acting on each of said shell elements of said tire portion;

(k) performing computations of dynamic radial fatigue test by linear numerical analysis to calculate said distribution of stress applied to said wheel;

(l) examining whether or not a difference between said calculated distribution of stress and a measured distribution of stress is zero; and (m) if said difference is not zero, repeating said computations with at least one initial data (f) to (j) modified until said difference becomes zero thereby determining an optimum analysis condition.

7. The method according to claim 6, wherein said initial data modified in the step (m) for repeating the computations is the geometric shapes, sizes and material properties defined in said step (f) and the magnitude and/or the direction defined in said step (j).

8. The method according to claim 6, wherein said two-dimensional shell elements of each row is connected by two one-dimensional beam elements in a circumferential direction.

9. The method according to claim 6, wherein said method is followed by the following steps comprising:

(n) modeling a wheel design being optimized by linear three-dimensional solid elements;

(o) providing wheel design valuables with respect to each of said solid elements modeling the wheel of the step (n);

(p) creating a composite model of said wheel model in the step (n) and the optimum analysis condition determined by the steps (a) to (m);

(q) performing computations of dynamic radial fatigue test by linear numerical analysis to calculate said distribution of stress applied to said wheel of the step (n);

(r) examining whether or not the calculated results satisfy a constrain condition for the fatigue endurance;

(s) if said calculated results do not satisfy said constrain condition, repeating the step (q) with at least one of said design valuables modified until said constrain condition is satisfied;

(u) examining whether or not a weight of said wheel being optimized is minimal; and (v) if said weight is not minimal, repeating the steps (q) to (s) with at least one of said design valuables modified until said weight reaches minimal.

10. A method of evaluating endurance of a vehicle wheel by calculating a distribution of stress applied to said vehicle wheel by computer simulation of a dynamic radial fatigue test of said vehicle wheel mounting a tire thereon, said method comprising the steps of:

(a) modeling a wheel portion by linear three-dimensional solid elements;

(b) modeling a tire portion by linear three-dimensional solid elements;

(c) modeling a pressure by air filling said tire portion as a surface pressure acting on an inner surface of said tire portion contacting said wheel;

(d) modeling a press-contact effect of a tire bead portion on a wheel flange as a direct load acting on a wheel flange;

(e) modeling a load applied from a dynamic radial fatigue testing apparatus through a contact between said tire portion and a drum as a direct load acting on each of said solid elements modeling said tire portion;

(f) providing geometric shapes and material properties with respect to each of said solid elements modeling said tire portion;

(g) providing material properties with respect to each of said solid elements modeling said wheel portion;

(h) providing a magnitude and/or a direction of said surface pressure;

(i) providing a magnitude and/or a direction of said direct load acting on the wheel flange;

(j) providing a magnitude and/or a direction of said direct load acting on each of said solid elements modeling said tire portion;

(k) performing computations by linear numerical analysis to calculate said distribution of stress applied to said wheel;

(l) examining whether or not a difference between said calculated distribution of stress and a measured distribution of stress is zero; and (m) if said difference is not zero, repeating said computations with at least one initial data (f) to (j) modified until said difference becomes zero.

11. The method according to claim 10, wherein said initial data modified in the step (m) for repeating the computations is the material constants and geometric shapes defined in said step (f) and the magnitude and/or the direction defined in said step (j).

12. The method according to claim 10, wherein said method is followed by the following steps comprising:

(n) modeling a wheel design being optimized by linear three-dimensional solid elements;

(o) providing wheel design valuables with respect to each of said solid elements modeling the wheel of the step (n);

(p) creating a composite model of said wheel model in the step (n) and the optimum analysis condition determined by the steps (a) to (m);

(q) performing computations of dynamic radial fatigue test by linear numerical analysis to calculate said distribution of stress applied to said wheel of the step (n);

(r) examining whether or not the calculated results satisfy a constrain condition for the fatigue endurance;

(s) if said calculated results do not satisfy said constrain condition, repeating the step (q) with at least one of said design valuables modified until said constrain condition is satisfied;

(u) examining whether or not a weight of said wheel being optimized is minimal; and (v) if said weight is not minimal, repeating the steps (q) to (s) with at least one of said design valuables modified until said weight reaches minimal.

* * * * *